(12) United States Patent
Reinten et al.

(10) Patent No.: US 9,925,769 B2
(45) Date of Patent: Mar. 27, 2018

(54) MEMS CHIP AND METHOD OF MANUFACTURING A MEMS CHIP

(71) Applicant: OCE-TECHNOLOGIES B.V., Venlo (NL)

(72) Inventors: Hans Reinten, Venlo (NL); Hendrik J. Stolk, Venlo (NL); Alex N. Westland, Venlo (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 15/174,275

(22) Filed: Jun. 6, 2016

(65) Prior Publication Data

US 2016/0279944 A1 Sep. 29, 2016

Related U.S. Application Data

(63) Continuation of application No. PCT/EP2014/078257, filed on Dec. 17, 2014.

(30) Foreign Application Priority Data

Dec. 20, 2013 (EP) .................................... 13198864

(51) Int. Cl.
| | |
|---|---|
| *B41J 2/14* | (2006.01) |
| *H01L 23/00* | (2006.01) |
| *B41J 2/16* | (2006.01) |
| *B81C 1/00* | (2006.01) |

(52) U.S. Cl.
CPC ....... *B41J 2/14201* (2013.01); *B41J 2/14233* (2013.01); *B41J 2/161* (2013.01); *B41J 2/1623* (2013.01); *B81C 1/00269* (2013.01); *H01L 24/03* (2013.01); *B41J 2002/14362* (2013.01); *B81C 2201/0143* (2013.01); *B81C 2203/032* (2013.01)

(58) Field of Classification Search
CPC .. B41J 2/14201; B41J 2/14233; B41J 2/1623; B41J 2/161; B41J 2002/14362; B81C 1/00269; B81C 2203/032; B81C 2201/0143; H01L 24/03
See application file for complete search history.

(56) References Cited

U.S. PATENT DOCUMENTS

| | | | |
|---|---|---|---|
| 6,361,152 B1 * | 3/2002 | Fujisawa | B41J 2/14274 347/68 |
| 6,406,636 B1 * | 6/2002 | Vaganov | B23K 1/0016 216/2 |
| 9,475,278 B2 * | 10/2016 | Rivas | B41J 2/14024 |
| 2003/0137564 A1 * | 7/2003 | Nakashima | B41J 2/161 347/68 |
| 2007/0035589 A1 | 2/2007 | Takahashi et al. | |

FOREIGN PATENT DOCUMENTS

WO WO 2006/089337 A1 8/2006

* cited by examiner

*Primary Examiner* — Geoffrey Mruk
(74) *Attorney, Agent, or Firm* — Birch, Stewart, Kolasch & Birch, LLP

(57) ABSTRACT

A MEMS chip having at least two chip components bonded together by means of an adhesive layer that is applied to at least one of two mating bonding surfaces of the two components, wherein a pattern of finely distributed micro-cavities is formed in at least one of the two mating bonding surfaces, said micro-cavities being arranged to accommodate a major part of the adhesive.

19 Claims, 3 Drawing Sheets

MEMS CHIP AND METHOD OF MANUFACTURING A MEMS CHIP

CROSS REFERENCE TO RELATED APPLICATIONS

This application is a Continuation of PCT International Application No. PCT/EP2014/078257, filed on Dec. 17, 2014, which claims priority under 35 U.S.C. 119(a) to patent application Ser. No. 13/198,864.4, filed in Europe on Dec. 20, 2013, all of which are hereby expressly incorporated by reference into the present application.

The invention relates to a MEMS chip having at least two chip components bonded together by means of a layer of adhesive that is applied to at least one of two mating bonding surfaces of the two components.

An example of a MEMS chip to which the invention is applicable is an array of nozzle and actuator units of an ink jet print head, as has been described in U.S. 2007-035589 A1. In this case, the chip comprises a plurality of nozzles each of which is connected to an ink duct and associated with a piezoelectric actuator which, when energized, creates a pressure wave in the ink contained in the ink duct, so that an ink droplet is expelled from the nozzle. Each of the actuator units comprises, as main components, a substrate plate, a chamber block and a duct block. The chamber block is bonded to one surface of the substrate plate and defines an ink chamber and a nozzle connected thereto. The duct block is bonded to the opposite side of the substrate plate and defines an ink duct and an actuator chamber for accommodating a piezoelectric actuator that is separately bonded to the substrate plate. The ink duct communicates with the ink chamber via a passage formed in the substrate plate. The portion of the substrate plate that delimits the actuator chamber serves as a flexible membrane flexing into and out of the ink chamber when the piezoelectric actuator is activated, so that an acoustic pressure wave is generated in the ink chamber and an ink droplet is expelled from the nozzle. Since the substrate plate is excited to high frequency vibrations by the piezoelectric actuator, and the deformation properties of the substrate plate have a crucial influence on the drop generation process, it is important that the adhesive bonds between the duct plate, the substrate plate and the chamber plate can be formed reliably and reproducibly.

It is an object of the invention to improve the adhesive bond between the components.

According to the invention, a pattern of finely distributed micro-cavities is formed in at least one of the two mating bonding surfaces, said micro-cavities being arranged to accommodate a major part of the adhesive.

The invention has the advantage that the meniscus at the edge of the adhesive layer can be controlled more precisely and more reliably. Moreover, the micro-cavities permit the use of more viscous adhesives and will generally improve the reliability of the adhesive bonds, because a large part of the adhesive volume is trapped in the micro-cavities and the thickness of the adhesive layer in the dam portions between the micro-cavities is reduced. When the adhesive should contain impurities, such as dirt particles, these may either be accommodated in one of the micro-cavities or crunched with increased pressure in the regions of the dam portions.

In particular, the total volume of the micro-cavities is selected such that the total volume of the adhesive applied on the dam portions can be accommodated in the micro-cavities. Upon joining the mating bonding surfaces, the applied layer of adhesive is then forced into the micro-cavities, leaving only a minimal amount of adhesive between the mating bonding surfaces. Thus, a thin layer of adhesive remains between the mating bonding surfaces.

In order to enable the adhesive to flow into the cavities, a trajectory for the adhesive towards the micro-cavities should be kept short. Therefore, micro-cavities are provided finely distributed, meaning that a trajectory for the adhesive to a micro-cavity is sufficiently short.

Commonly used adhesives in the field of MEMS processing may be applied in a layer having a thickness of about 2 micron. Employing the method according to the invention and, for example, selecting the dimensions of the micro-cavities such that they cover about half of a surface area of one of the two mating bonding surfaces, the adhesive is applied on the remaining half of the surface area (surface of the dam portions) and a depth of the micro-cavities should be selected to be at least equal to the thickness of the layer of adhesive, i.e. 2 micron, preferably larger, in order to provide sufficient volume to accommodate the total volume of the adhesive. In an embodiment, the volume of the micro-cavities may be more than twice the volume of the adhesive being applied. When the chip components define a passage that passes through one or more of the adhesive layers, the improved controllability of the meniscus reduces the risk that the passage becomes clogged or the cross-section of the passage varies due to variations in size of the meniscus. In cases where the meniscus delimits a filter surface area, for example, a reduced size of the meniscus assures a large and reproducible filter surface area. In cases where the meniscus delimits a membrane, the reduced thickness of the adhesive layer reduces the influence of the meniscus on the size and the elastic properties of the membrane. When an adhesive layer is necessary in a part of the chip where wirebond pads are to be formed for electrically contacting the chip, the reduced thickness of the adhesive film will result in a more robust process window during the wirebonding step.

In order to accurately control the meniscus position, a distance between the passage and a micro-cavity may be controlled and selected. The adhesive may be applied in a thick layer. The two mating bonding surfaces are then pressed such that the adhesive flows into the micro-cavities. However, at a boundary of a passage passing through the adhesive layer, the adhesive may flow towards the passage. Having a distance towards a micro-cavity as small as possible ensures that only little adhesive flows towards the passage. Hence, the distance between the passage and the micro-cavities should be selected small. On the other hand, if the distance becomes too small, a dam portion between the micro-cavity and the passage may become weak and prone to impairment. Also, a too small distance may prevent adhesive being applied on the dam portion.

Further, it is noted that the method according to the present invention provides for bonding by the adhesive remaining between the two mating bonding surfaces, i.e. the bonding is not intended to be provided by the adhesive flown into the micro-cavities, although in an embodiment the bonding may be strengthened by the adhesive flown into the micro-cavities. Thus, a relatively thin layer of adhesive (as small as about 20 nanometer is obtainable) provides for the bonding strength, while a stiffness of the thin adhesive layer is large. In the prior art methods, the adhesive layer is relatively thick and, as the adhesive is relatively flexible, the resulting stiffness is relatively low. Using the method according to the present invention, it is possible to use the prior art adhesives, that can only be applied in a relatively thick layer, for obtaining a thin and stiff adhesive layer, which may be relevant in particular for elastic properties of a membrane, for example. Further, variations in adhesive layer thickness are reduced and potentially prevented.

According to a preferred manufacturing method, the micro-cavities and other functional 3D-structures in the chip components are formed in a common processing step, preferably on wafer scale.

More specific optional features of the invention are indicated in the dependent claims.

Embodiment examples will now be described in conjunction with the drawings, wherein.

Figure 1:
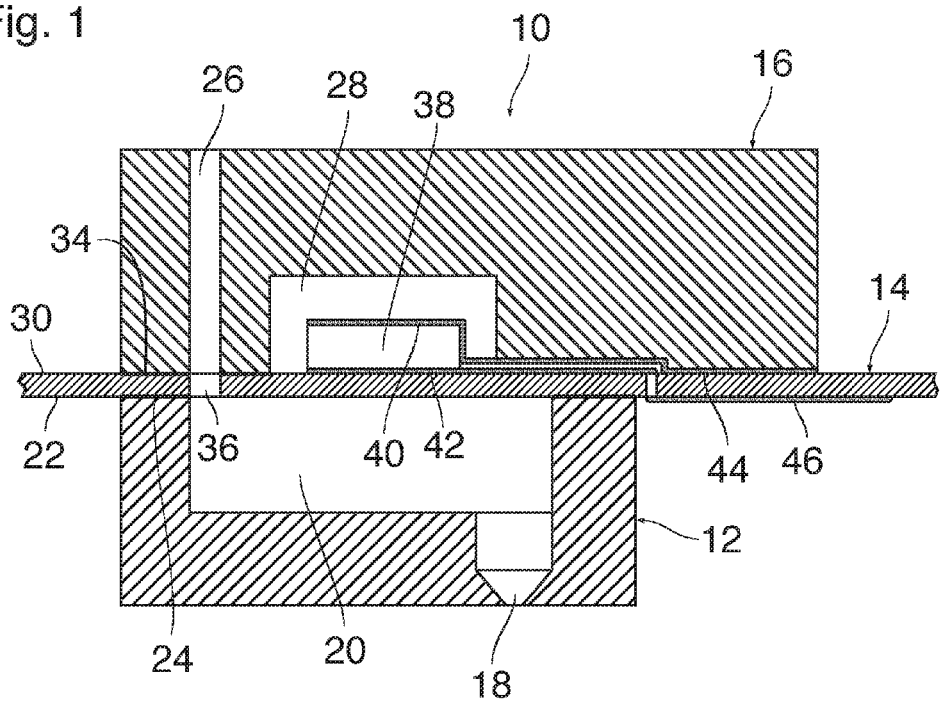
FIG. 1 is a sectional view of an individual actuator unit in a MEMS chip according to the invention.

As is shown in FIG. 1, an actuator unit of a piezoelectric ink jet MEMS chip 10 comprises, as main components, a chamber block 12, a substrate plate 14 and a duct block 16. The chamber block 12 defines a nozzle 18 and an ink chamber 20 and is bonded to one surface 22 of the substrate plate 14 by means of an adhesive layer 24. The duct block 16 defines an ink duct 26 and an actuator chamber 28 and is bonded to the opposite surface 30 of the substrate plate 14 by means of an adhesive layer 34. The ink duct 26 is separate from the actuator chamber 28 and communicates with the ink chamber 20 via a passage 36 that traverses the substrate plate 14 and the two adhesive layers 24 and 34.

The actuator chamber 28 is delimited on one side by the substrate plate 14 and accommodates a piezoelectric actuator 38 that is bonded to the top surface of the substrate plate 14 and has electrodes 40, 42 that are electrically connected to leads 44, 46 formed on the substrate plate 14.

In operation, liquid ink is supplied to the ink chamber 20 via the ink duct 26. The orifice of the nozzle 18 may be so small that the surface tension of the liquid prevents the ink from leaking out of the nozzle or other well-known measures may be applied to prevent ink leakage. Only when a voltage is applied to the electrode 40 while the electrode 42 is grounded, the actuator 38 is caused to deform in a bending mode, thereby flexing the portion of the substrate plate 14 that delimits the actuator chamber 28 and serves as a flexible membrane. As a result, an acoustic pressure wave is generated in the liquid in the ink chamber 20, and an ink droplet is expelled from the nozzle 18.

Figure 2:
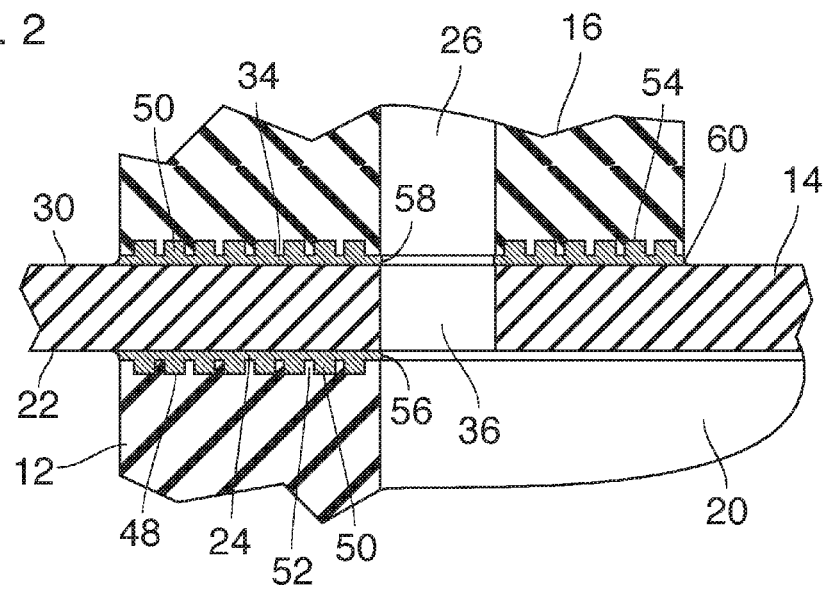
FIG. 2 shows an enlarged detail of FIG. 1.

FIG. 2 is an enlarged detail of FIG. 1, showing the vicinity of the passage 36. The adhesive layer 24 is formed between the surface 22 of the substrate plate 14 and a mating bonding surface 48 of the chamber block 12. The bonding surface 48 has a pattern of finely and evenly distributed micro-cavities 50 that accommodate an essential part of the volume of the adhesive, leaving only a very thin adhesive film of only a few atom layers between the surface 22 and the dam portions 52 that separate the micro-cavities 50.

Similarly, the adhesive layer 34 that is formed between the surface 30 of the substrate plate 14 and a mating bonding surface 54 of the duct block 16 is also formed with the micro-cavities 50.

Figure 3:
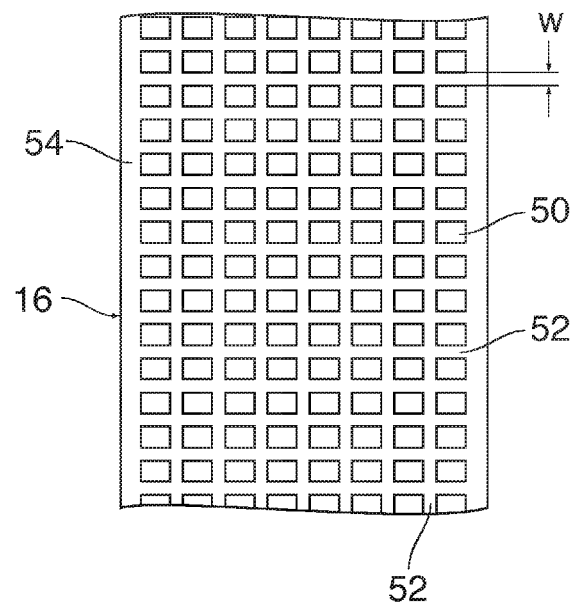
FIG. 3 is an enlarged plan view of a part of the MEMS chip.

FIG. 3 is a plan view of a part of the bonding surface 54 of the duct block 16 and shows an example of the configuration of the micro-cavities 50 and the dam portions 52 formed therebetween. In this example, the micro-cavities 50 have rectangular cross sections and are arranged such that the dam portions 52 extend straight in two orthogonal directions. In a preferred embodiment, the width w of the dam portions 52 is less than 20 μm, preferably less than 10 μm. The dimensions of an individual micro-cavity 50 are preferably smaller than 30×50 μm and the depth may be smaller than 30 μm, so that the volume will typically be less than 50 pl., to be selected depending on the application and embodiment. Further, in this example, the total area covered by the micro-cavities 50 is more than 50% of the area of the bonding surface 54.

As has been shown in FIG. 2, the adhesive layers 24 and 34 form a meniscus 56 and 58, respectively, at the wall of the passage 36, and the adhesive layer 34 forms another meniscus 60 at the edge of the actuator chamber 28. However, since the adhesive layer between the substrate plate 14 and the dam portions 52 is extremely small (e.g. less than 100 nm or less than 30 nm), the menisci 56, 58 and 60 are very small.

Figure 4:
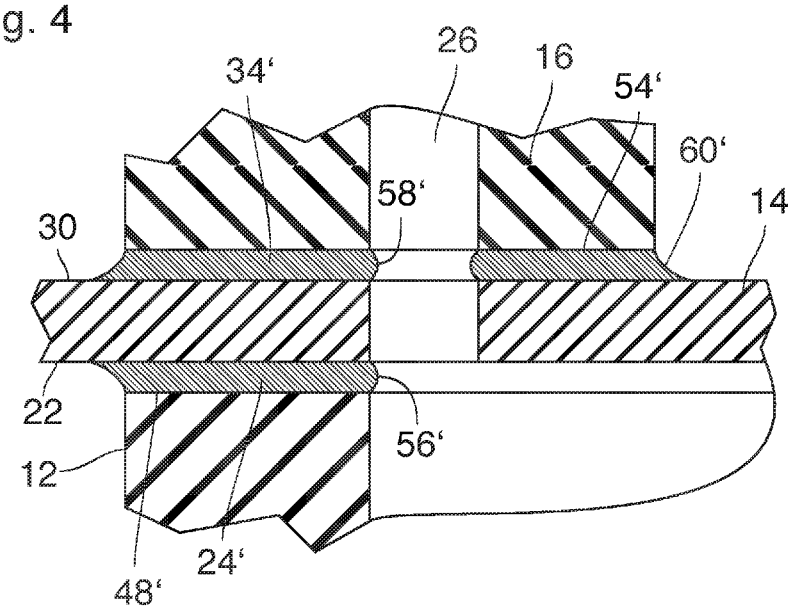
FIG. 4 is a view analogous to FIG. 2, showing a MEMS chips according to the prior art.

For comparison, FIG. 4 shows a conventional chip in which the bonding surfaces 48' and 54' have no micro-cavities. As a consequence, the thickness of the adhesive layers 24', 34' is significantly larger, and, correspondingly, each meniscus 56', 58', 60' has also a considerable size. In general, without the micro-cavities 50, the size and shape of the meniscus is more difficult to control.

It will be understood that the meniscus 58 and 58', respectively, determines the effective cross-section of the ink duct 26 which has a significant effect on the acoustic properties of the ink volume in the ink duct 26 and the ink chamber 20 and hence on the drop generation process.

Moreover, it can be seen in FIG. 4 that the meniscus 60' constricts the area of the substrate plate 14 that serves as a flexible membrane and is deflected by the piezoelectric actuator. Consequently, the meniscus 60' has a significant influence on the elastic properties of the flexible membrane and, again, on the drop generation process.

By providing the micro-cavities 50, the invention permits to greatly improve the control of the meniscus of the adhesive layers and to improve the reproducibility of the drop generation properties of the actuators.

In a typical manufacturing process, a plurality of MEMS chips 10 will be produced from common wafers. The duct blocks 16 of a plurality of chips 10 will originally form a wafer in which the minute structures forming the ink ducts 26, the actuator chambers 28, and other structures as the case may be, may be formed by means of process steps such as (photo-) lithographic processing, laser-cutting, or the like. Then, the micro-cavities 50 in the bonding surface 34 may be formed with high efficiency in the same process steps and with the same processing technologies. The same applies equivalently to the chamber blocks 12 and the micro-cavities 50 in the bonding surfaces 24.

In an alternative embodiment, however, it would also be possible to form micro-cavities in the surfaces 22, 30 of the substrate plate 14 or in the mating surfaces of both components that are bonded together.

Figure 5A:
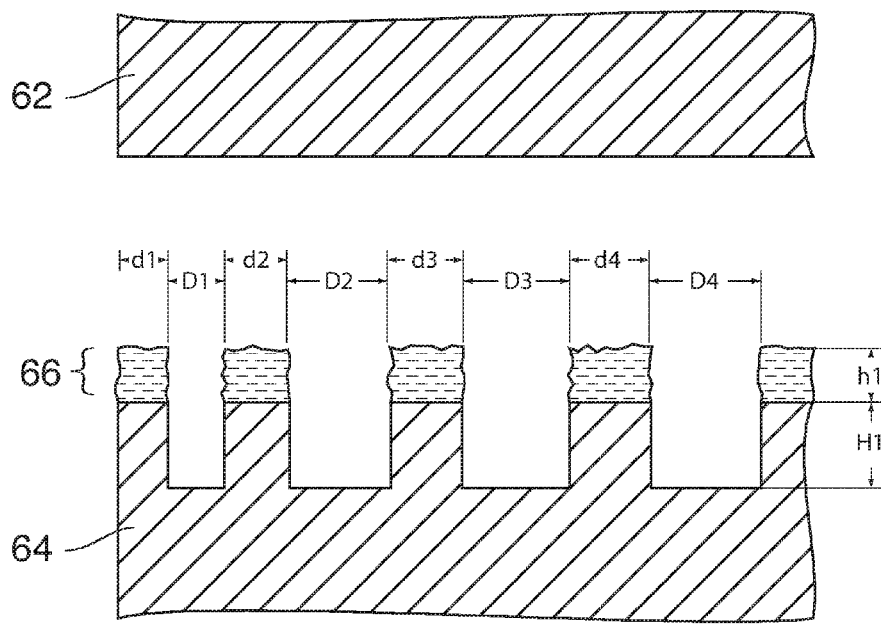
FIGS. 5A and 5B are enlarged cross-sectional views of two mating components in a state prior to bonding and in a bonded state, respectively.
Figure 5B:
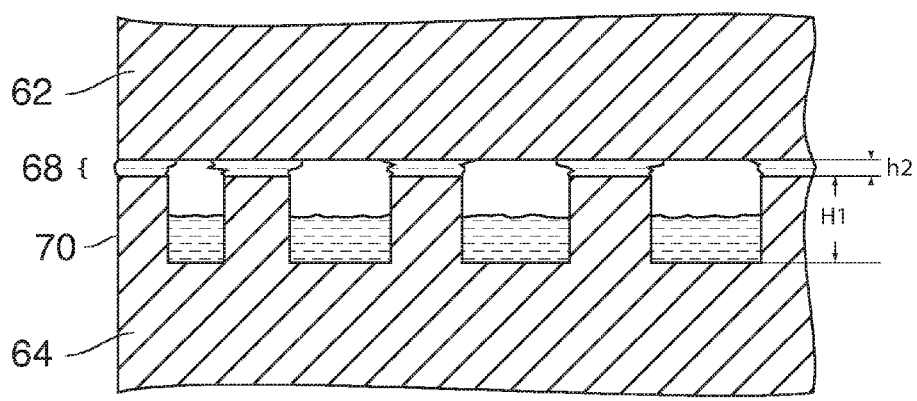

An example of a bonding process according to the invention has been illustrated in FIGS. 5A and 5B which both show mating bonding surfaces of two components 62, 64 in a state immediately before they are bonded together (FIG. 5A) and in a bonded state (FIG. 5B). The component 64 has micro-cavities with an identical depth H1 and with different widths D1, D2, D3, D4, separated by dam portions with widths d1, d2, d3, d4.

A layer 66 of an adhesive has been applied to the bonding surface of the component 64 so as to cover the top surfaces of the dam portions. The adhesive has a relatively high viscosity, so that the thickness of the layer 66 cannot be made smaller than about 2 μm, for example.

In FIG. 5B, the two components 62, 64 have been pressed together so that, before the adhesive has cured, most of the adhesive is squeezed into the micro-cavities and accommodated therein, leaving only a very thin adhesive layer 68 on the dam portions. For example, the thickness h2 of the layer 68 may be as small as 20 nm. After curing, this results in a bond with very high strength and rigidity.

It can be seen that the volume of the micro-cavities is so large that the entire volume of the adhesive (or even twice this volume) could be accommodated therein. In this way, it is possible to make the layer 68 very thin. Moreover, the widths d1-d4 of the dam portions are so small in comparison to the initial thickness h1 of the adhesive layer, that, when the components 62, 64 are pressed together, almost all of the adhesive will readily flow into the nearest micro-cavity.

In the example shown, the width d1 of the dam portion that separates a first micro-cavity (with width D1) from an end face 70 of the components 62, 64, which end face may form a wall of a passage through the components, is particularly small, i.e. smaller than the widths of all other dam portions. This permits to control and limit the meniscus that the layer 68 forms at the end face 70. Moreover, in the example shown, the width of the dam portions decreases with decreasing distance from the end face 70, i.e. $d1<d2<d3<d4, \ldots$, at least for the first few micro-cavities as counted from the end face 70.

Similarly, in the example shown, the widths D1-D4 of the micro-cavities also decrease with decreasing distance from the end face 70.

The invention claimed is:

1. A MEMS chip comprising:
   at least two chip components bonded together by means of an adhesive layer that is applied to at least one of two mating bonding surfaces of the two components,
   wherein a pattern of finely distributed micro-cavities defined by a plurality of dam portions is formed in at least one of the two mating bonding surfaces, said micro-cavities being arranged to accommodate at least a major part of the adhesive,
   wherein a total volume of said micro-cavities is arranged in such a manner that a total volume of the adhesive layer applied can be accommodated in the micro-cavities, and
   wherein the bonding surfaces include both top surfaces of the plurality of dam portions and interior surfaces of the micro-cavities defined by the plurality of dam portions.

2. The chip according to claim 1, wherein said components define a passage that passes through the adhesive layer.

3. The chip according to claim 1, wherein one of said components has a portion that constitutes a flexible membrane and is delimited by said bonding surface.

4. The chip according to claim 1, wherein said components constitute at least one piezoelectric actuator unit.

5. The chip according to claim 4, constituting a nozzle and actuator array of an ink jet print head.

6. The chip according to claim 1, wherein the total area covered by the micro-cavities is more than 50% of the area of the bonding surface.

7. The chip according to claim 1, wherein a width of each of the micro-cavities is less than 20 μm, and a depth of each of the micro-cavities is less than 30 μm.

8. The chip according to claim 1, wherein a portion of the adhesive layer, in a form of a thin layer, arranged between the top surfaces of the plurality of dam portions and the other one of two mating bonding surfaces, and a thickness of the thin layer is less than 100 nm.

9. The chip according to claim 1, wherein a width of a micro-cavity which is disposed a most adjacent micro-cavity to an end face, defining a passage through the two mating bonding surfaces, of the two mating bonding surfaces, is smaller than widths of other micro-cavities that are more remote from said end face.

10. A method of manufacturing a MEMS chip having at least two chip components bonded together by means of an adhesive layer that is applied to at least one of two mating bonding surfaces of the two components, said method comprising the steps of:
    forming a pattern of finely distributed micro-cavities defined by a plurality of dam portions in a bonding surface of at least one of said components;
    applying at an adhesive on the bonding surface; and
    bonding the components together,
    wherein at least a major part of the adhesive is accommodated in the micro-cavities, and wherein a total volume of said micro-cavities is arranged in such a manner that a total volume of the adhesive layer applied can be accommodated in the micro-cavities, and
    wherein the bonding surfaces include both top surfaces of the plurality of dam portions and interior surfaces of the micro-cavities defined by the plurality of dam portions.

11. The method according to claim 10, wherein a thickness of said adhesive layer, when applied to the bonding surface, is smaller than a depth of said micro-cavities.

12. The method according to claim 11, wherein the thickness of the adhesive layer is not more than 50% of the depth of the micro-cavities.

13. The method according to claim 10, wherein the total volume of the micro-cavities is larger than the volume of the adhesive forming the adhesive layer.

14. The method according to claim 10, wherein a width of a dam portion that separates a micro-cavity from an end face of one of the two components, where the adhesive layer forms a meniscus, is made smaller than a width of the dam portions between other micro-cavities that are more remote from said end face.

15. The method according to claim 10, wherein said micro-cavities are formed together with other functional structures of the same chip component in a common processing step.

16. The method according to claim 15, wherein said processing step comprises lithographic processing.

17. The method according to claim 15, wherein said processing step comprises laser cutting.

18. The method according to claim 15, wherein said processing step is performed on a wafer that is then processed further to constitute components of a plurality of chips.

19. A MEMS chip comprising:
    at least two chip components bonded together by means of an adhesive layer that is applied to at least one of two mating bonding surfaces of the two components,
    wherein a pattern of finely distributed micro-cavities is formed in at least one of the two mating bonding surfaces, said micro-cavities being arranged to accommodate at least a major part of the adhesive,
    wherein a total volume of said micro-cavities is arranged in such a manner that a total volume of the adhesive layer applied can be accommodated in the micro-cavities, and
    wherein the micro-cavities are partially filled.

* * * * *